United States Patent
Cao et al.

(10) Patent No.: US 9,135,386 B2
(45) Date of Patent: Sep. 15, 2015

(54) MULTI-MODE SCHEDULER FOR CLOCK TREE SYNTHESIS

(71) Applicant: Synopsys, Inc., Mountain View, CA (US)

(72) Inventors: Aiqun Cao, Sunnyvale, CA (US); Ssu-Min Chang, Cupertino, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/141,270

(22) Filed: Dec. 26, 2013

(65) Prior Publication Data

US 2014/0181766 A1    Jun. 26, 2014

Related U.S. Application Data

(60) Provisional application No. 61/746,068, filed on Dec. 26, 2012.

(51) Int. Cl.
*G06F 17/50*    (2006.01)
*G06F 1/10*    (2006.01)

(52) U.S. Cl.
CPC .............. *G06F 17/505* (2013.01); *G06F 1/10* (2013.01)

(58) Field of Classification Search
CPC ...... G06F 1/10; G06F 17/505; G06F 2217/62
USPC .......... 716/101–104, 108, 132, 134
See application file for complete search history.

(56) References Cited

U.S. PATENT DOCUMENTS

| | | |
|---|---|---|
| 2004/0168140 A1 * | 8/2004 | Chang .............................. 716/6 |
| 2008/0168412 A1 | 7/2008 | Cheon et al. |
| 2008/0263488 A1 | 10/2008 | Banerji et al. |
| 2009/0217225 A1 * | 8/2009 | Sunder et al. ..................... 716/6 |
| 2011/0239173 A1 | 9/2011 | Ravi |
| 2012/0159416 A1 | 6/2012 | Jiang et al. |
| 2012/0240091 A1 | 9/2012 | Sunder et al. |

* cited by examiner

*Primary Examiner* — Paul Dinh
(74) *Attorney, Agent, or Firm* — Park, Vaughan, Fleming & Dowler LLP; Laxman Sahasrabuddhe

(57) ABSTRACT

Techniques and systems for performing clock tree synthesis (CTS) across multiple modes are described. Some embodiments traverse one or more clock trees from the root of each clock tree to a set of sinks of the clock tree. During the traversal, each clock gate can be marked with a traversal level, and each sink can be marked with one or more clocks and one or more modes that are associated with the sink. A task queue can then be created based on the information collected during the clock tree traversal and populated with different types of tasks based on skew balancing requirements across different modes, and the task queue can be provided to a CTS engine to achieve high-quality skew-balanced clock trees across all modes.

15 Claims, 2 Drawing Sheets

MULTI-MODE SCHEDULER FOR CLOCK TREE SYNTHESIS

RELATED APPLICATION

This application claims priority to U.S. Provisional Application Ser. No. 61/746,068, by the same inventors, filed on 26 Dec. 2012, the contents of which are herein incorporated by reference in their entirety for all purposes.

BACKGROUND

1. Technical Field

This disclosure relates to electronic design automation (EDA). More specifically, this disclosure relates to a multi-mode scheduler for clock tree synthesis (CTS) to achieve high-quality skew-balanced clock trees across multiple modes.

2. Related Art

Advances in process technology and a practically unlimited appetite for consumer electronics have fueled a rapid increase in the size and complexity of integrated circuit (IC) designs. The goal of clock tree synthesis is to convert a high-level description of a clock tree into an implementation that meets a set of constraints (e.g., clock skew constraints, area constraints, power constraints, routing constraints, placement constraints, etc.). Today's IC designs typically have multiple modes for operation (e.g., functional mode and test mode), and each mode typically has its own clock. Due to the rapidly increasing size and complexity of IC designs, and also because IC designs have multiple modes, it is becoming increasingly difficult to create high quality clock trees for IC designs, especially to meet skew balancing constraints across all modes.

SUMMARY

Some embodiments described herein provide techniques and systems for performing clock tree synthesis across all modes. Some embodiments can traverse one or more clock trees from the root of each clock tree to a set of sinks of the clock tree, wherein said traversing can be performed across different clocks and modes. While performing said traversing, the embodiments can mark each clock gate with a traversal level, and mark each sink with one or more clocks and one or more modes that are associated with the sink. Next, the embodiments can create a task queue for a CTS engine, wherein each task is associated with a clock gate, and wherein tasks are scheduled in the task queue in decreasing traversal level (i.e., from the clock sinks to the clock root). The embodiments can then provide the task queue to the CTS engine. The CTS engine can then perform the tasks in the task queue in the appropriate order, thereby synthesizing the clock tree while taking into consideration balancing requirements across all modes and clocks. In some embodiments, the CTS engine can perform the tasks in parallel if the tasks are associated with clock gates in the same traversal level.

In some embodiments, the task queue includes a task that instructs the CTS engine to synthesize a net driven by a clock gate without performing skew balancing. In some embodiments, the task queue includes a task that instructs the CTS engine to synthesize a net driven by a clock gate, and perform skew balancing on the net. In some embodiments, the task queue includes a task that instructs the CTS engine to perform delay insertion to meet a given target latency for a sub-tree that is rooted at a clock gate.

DETAILED DESCRIPTION

Figure 1:
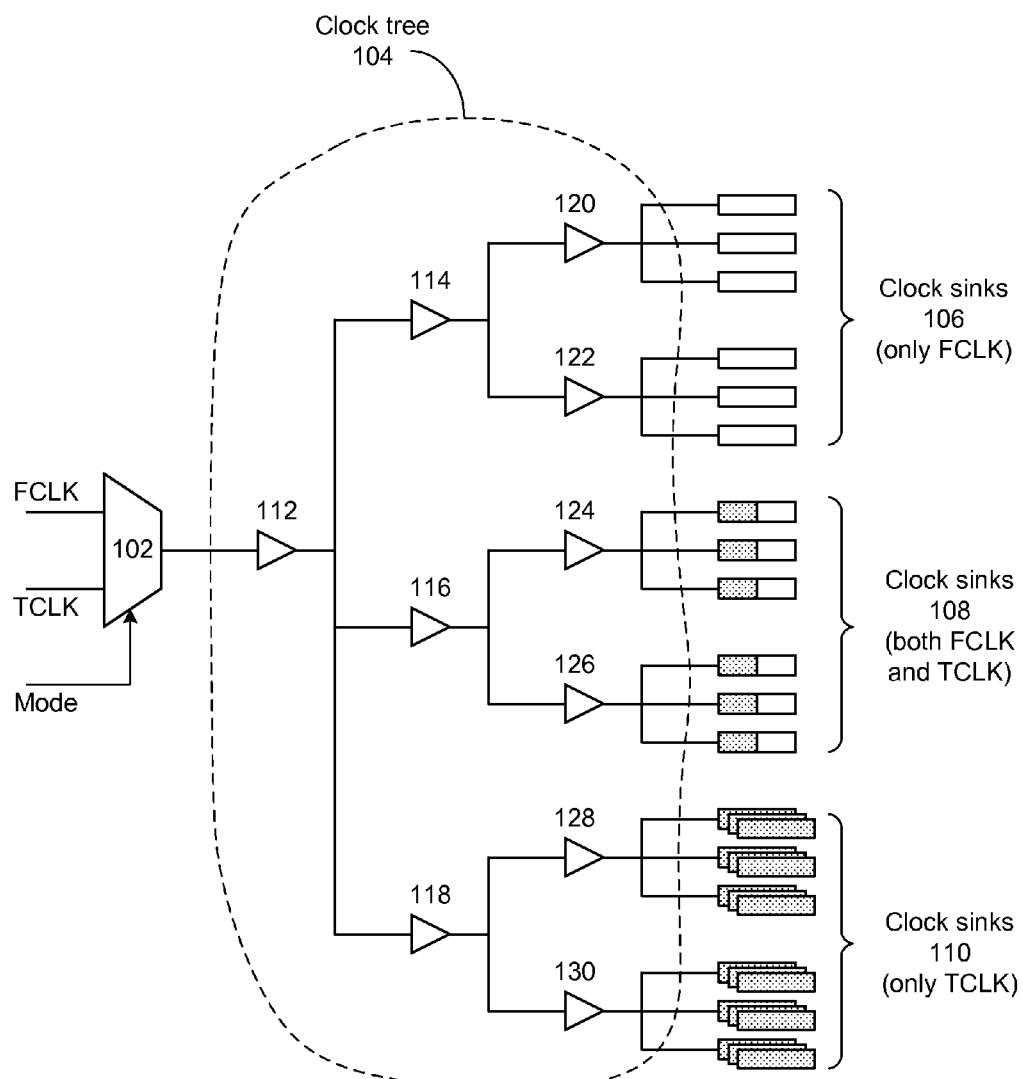
FIG. 1 illustrates a clock tree in a circuit design that has multiple clocks and multiple modes in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z.

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are for illustrative purposes only and are not intended to limit the embodiments to the forms disclosed.

Some EDA software tools enable circuit designers to describe the functionality of the circuit design. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Multi-Mode Scheduler for Clock Tree Synthesis

Circuit designs typically have multiple functional clocks that correspond to different functional modes, and also typically have multiple test clocks that correspond to a test mode. At any given time, each sequential circuit element in the circuit design may be driven by one of several clocks. In other words, the different clock domains in the circuit design (i.e., the different portions of a circuit design that are clocked by different clocks) may overlap with each other. It is desirable to share the clock tree between different clocks to reduce the amount of area used by the clock tree.

FIG. 1 illustrates a clock tree in a circuit design that has multiple clocks and multiple modes in accordance with some embodiments described herein. Clock tree 104 couples the output from multiplexer 102 with clock sinks 106, 108, and 110. Note that clock tree 104 has multiple levels. The root of the clock tree (i.e., the output of multiplexer 102) can be assigned the level 0, and each subsequent level can be assigned a level number that is greater than the previous level. For example, clock gate 112 can be assigned level 1, clock gates 114, 116, and 118 can be assigned level 2, and clock gates 120, 122, 124, 126, 128, and 130 can be assigned level 3.

Multiplexer 102 receives two clock signals: the FCLK clock is used during normal operation and the TCLK clock is used during test. Multiplexer 102 outputs the appropriate clock signal depending on the mode as shown in FIG. 1. Clock sinks 106 are driven by only the FCLK clock, clock sinks 108 are driven by both FCLK and TCLK clocks, and clock sinks 110 are driven by only the TCLK clock. When clock tree 104 is constructed, the clock skew for clock sinks 106 and 108 needs to be balanced for the FCLK clock, and the clock skew for clock sinks 108 and 110 needs to be balanced for the TCLK clock. Unfortunately, conventional clock tree synthesis techniques often find it difficult to build a properly balanced clock tree in such situations.

Specifically, some conventional techniques build clock trees in a sequential fashion, i.e., conventional techniques build a clock tree for a given clock, balance the clock tree, and then start building the next clock tree for another clock. Unfortunately, these approaches can have convergence problems and result in clock trees with poor quality because the clock tree for each clock is built and balanced independently, i.e., without considering the balancing requirements of other clock trees of other clocks. Other conventional techniques attempt to build and balance a single clock tree that covers all clocks. Unfortunately, these techniques can also result in clock trees with poor quality because these techniques typically overbalance the clock tree, i.e., the techniques try to balance even those parts of the clock tree that don't need to be balanced with respect to each other, which may lead to more area and power overhead.

Some embodiments described herein do not have the above-described drawbacks. The embodiments perform a clock netlist traversal (e.g., from the root of the clock tree to the sinks) across all modes. During the traversal, the embodiments mark the clock tree with information that can be used to construct a task queue that can then be used for clock tree synthesis and balancing. For example, during the clock tree traversal, embodiments keep track of different clocks from different modes reaching different sub-trees and mark per-clock sinks/exceptions.

Once the clock tree traversal has been completed, the embodiments can create a task queue for storing CTS tasks. The task queue is then populated with CTS tasks that are generated based on the information that was collected during the clock tree traversal. For multi-mode designs, extra tasks may need to be inserted into the task queue. Specifically, the multiple tasks can allow certain sub-trees to be visited and processed more than once by the CTS engine. For example, in the first visit (e.g., the first task) the clock tree for the sub-tree can be synthesized, and in the second visit (e.g., the second task), the CTS engine can try to meet a given target latency (e.g., by adding delays at the appropriate locations in the clock tree).

Some embodiments can also include a built-in analysis capability to analyze the balancing requirements on a per-net basis across different modes. Some embodiments also allow traversal of the downstream sub-trees for the current net (i.e., the net in the clock tree that is currently being built and/or balanced) to find the best location to meet the balancing requirement among different sub-trees. This process is more efficient if the traversal is along the pre-existing gate levels only.

Once the scheduler has created the task queue and has populated the task queue with the appropriate tasks for the CTS engine, then the task queue can be provided to the CTS engine. The CTS engine can fetch and perform tasks from the task queue by starting from the head of the queue and working its way toward the tail of the queue. In general, each task may include DRC constraints (e.g., maximum transition, maximum capacitance, etc.), a target latency, and a target skew requirement.

Different types of tasks are now described. The first type of task instructs the CTS engine to synthesize and skew balance a net driven by a pre-existing clock gate. In this task, the CTS engine inserts a delay balanced buffer tree between the clock gate and the loads (i.e., clock sinks) driven by the clock gate. The buffers are inserted to not only meet the logical DRC constraints but also to achieve skew balancing on this net.

The second type of task instructs the CTS engine to synthesize the clock tree without performing skew balancing for a net driven by a pre-existing clock gate. This type of task is used for fixing logical DRC constraints only where skew balancing is not required, e.g., the top level net that electrically connects the sub-tree roots belonging to different clocks in different modes that are not required to be balanced.

The third type of task instructs the CTS engine to insert one or more delays in the clock tree to meet a given target latency value for the sub-tree rooted at a pre-existing gate that had been synthesized before. This type of task can be used when there are skew balancing requirements across multiple modes between different sub-trees.

Figure 2:
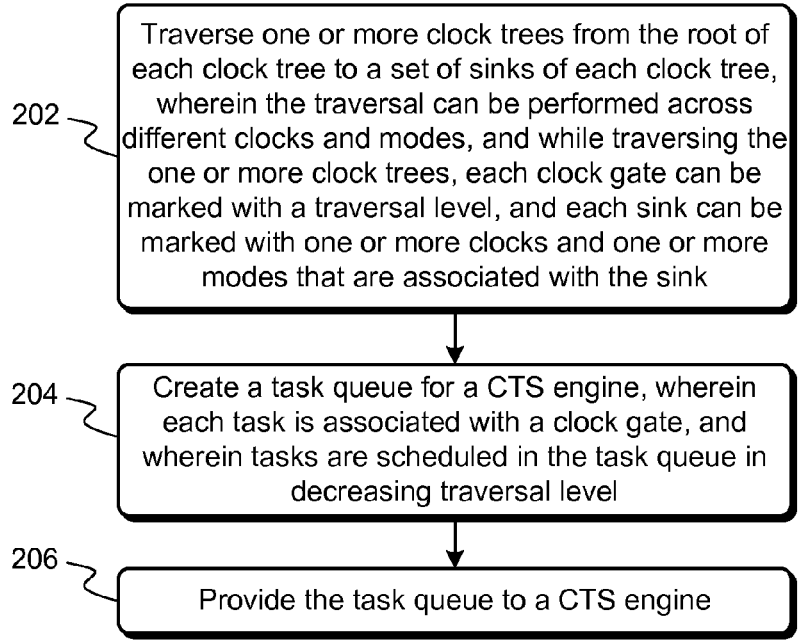
FIG. 2 illustrates a process for performing clock tree synthesis in accordance with some embodiments described herein.

FIG. 2 illustrates a process for performing clock tree synthesis in accordance with some embodiments described herein. The process can begin by traversing one or more clock trees from the root of each clock tree to a set of sinks of each clock tree, wherein the traversal can be performed across different clocks and modes, and while traversing the one or more clock trees, each clock gate can be marked with a traversal level, and each sink can be marked with one or more clocks and one or more modes that are associated with the sink (operation 202). Next, the process can create a task queue for a CTS engine, wherein each task is associated with a clock gate, and wherein tasks are scheduled in the task queue in decreasing traversal level (operation 204). The task queue can then be provided to a CTS engine (operation 206). The CTS engine can then perform the tasks in the task queue, thereby building and/or balancing the clock tree while taking into consideration balancing requirements across all modes and clocks.

In some embodiments, the task queue can include a task that instructs the CTS engine to synthesize a net driven by a clock gate without skew balancing. In some embodiments, the task queue can include a task that instructs the CTS engine to synthesize a net driven by a clock gate, and perform skew balancing on the net. In some embodiments, the task queue can include a task that instructs the CTS engine to perform delay insertion to meet a given target latency for a sub-tree that is rooted at a clock gate. In some embodiments, the tasks can be performed in parallel if the tasks are associated with clock gates in the same traversal level.

Computer System

Figure 3:
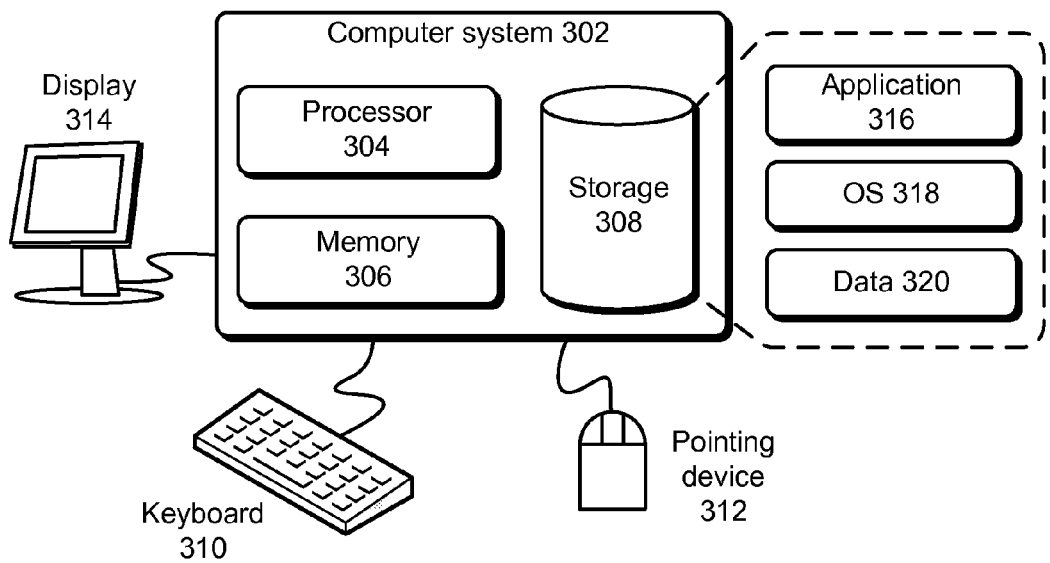
FIG. 3 illustrates a computer system in accordance with some embodiments described herein.

FIG. 3 illustrates a computer system in accordance with some embodiments described herein. A computer system can generally be any system that can perform computations. Specifically, a computer system can be a microprocessor, an application specific integrated circuit, a distributed computing system, a cloud computing system, or any other computing system now known or later developed. Computer system 302 comprises processor 304, memory 306, and storage 308. Computer system 302 can be coupled with display 314, keyboard 310, and pointing device 312. Storage 308 can generally be any device that can store data. Specifically, a storage device can be a magnetic, an optical, or a magneto-optical storage device, or it can be based on flash memory and/or battery-backed up memory. Storage 308 can store application 316, operating system 318, and data 320.

Application 316 can include instructions that when executed by computer 302 cause computer 302 to perform one or more processes that are implicitly or explicitly described in this disclosure. Data 320 can include any data that is inputted into or outputted by application 316.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) tool, a method for performing clock tree synthesis (CTS) in a circuit design, the method comprising:
traversing one or more clock trees from a root of each clock tree to a set of sinks of the clock tree, wherein said traversing is performed across different clocks and modes;
wherein while performing said traversing, marking each gate in the one or more clock trees with a traversal level, and marking each sink with one or more clocks and one or more modes that are associated with the sink;
creating a task queue for a CTS engine, wherein each task is associated with a gate in the one or more clock trees, wherein each task specifies instructions for synthesizing or modifying a clock tree, and wherein tasks are scheduled in the task queue in decreasing traversal level of the associated gate; and
providing the task queue to the CTS engine, wherein the CTS engine synthesizes and optimizes the one or more clock trees based on the tasks in the task queue, and wherein the circuit design is subsequently provided to a semiconductor fabrication facility for producing integrated circuit chips.

2. The method of claim 1, wherein the task queue includes a task that instructs the CTS engine to synthesize a net driven by a gate in the one or more clock trees without skew balancing.

3. The method of claim 1, wherein the task queue includes a task that instructs the CTS engine to synthesize a net driven by a gate in the one or more clock trees, and perform skew balancing on the net.

4. The method of claim 1, wherein the task queue includes a task that instructs the CTS engine to perform delay insertion to meet a given target latency for a sub-tree that is rooted at a gate in the one or more clock trees.

5. The method of claim 1, wherein tasks are performed in parallel if the tasks are associated with gates in the one or more clock trees in the same traversal level.

6. A non-transitory computer-readable storage medium storing instructions that, when executed by a computer, cause the computer to perform a method for performing clock tree synthesis (CTS) in a circuit design, the method comprising:
traversing one or more clock trees from a root of each clock tree to a set of sinks of the clock tree, wherein said traversing is performed across different clocks and modes;
wherein while performing said traversing, marking each gate in the one or more clock trees with a traversal level, and marking each sink with one or more clocks and one or more modes that are associated with the sink;
creating a task queue for a CTS engine, wherein each task is associated with a gate in the one or more clock trees, wherein each task specifies instructions for synthesizing or modifying a clock tree, and wherein tasks are scheduled in the task queue in decreasing traversal level of the associated gate; and providing the task queue to the CTS engine, wherein the CTS engine synthesizes and optimizes the one or more clock trees based on the tasks in the task queue, and wherein the circuit design is subsequently provided to a semiconductor fabrication facility for producing integrated circuit chips.

7. The non-transitory computer-readable storage medium of claim 6, wherein the task queue includes a task that instructs the CTS engine to synthesize a net driven by a gate in the one or more clock trees without skew balancing.

8. The non-transitory computer-readable storage medium of claim 6, wherein the task queue includes a task that instructs the CTS engine to synthesize a net driven by a gate in the one or more clock trees, and perform skew balancing on the net.

9. The non-transitory computer-readable storage medium of claim 6, wherein the task queue includes a task that instructs the CTS engine to perform delay insertion to meet a given target latency for a sub-tree that is rooted at a gate in the one or more clock trees.

10. The non-transitory computer-readable storage medium of claim 6, wherein tasks are performed in parallel if the tasks are associated with gates in the one or more clock trees in the same traversal level.

11. An apparatus, comprising:
a processor; and
a non-transitory storage medium storing instructions that, when executed by the processor, cause the apparatus to perform a method for performing clock tree synthesis (CTS), the method comprising:
traversing one or more clock trees from a root of each clock tree to a set of sinks of the clock tree, wherein said traversing is performed across different clocks and modes;
wherein while performing said traversing, marking each gate in the one or more clock trees with a traversal level, and marking each sink with one or more clocks and one or more modes that are associated with the sink;
creating a task queue for a CTS engine, wherein each task is associated with a gate in the one or more clock trees, wherein each task specifies instructions for synthesizing or modifying a clock tree, and wherein tasks are scheduled in the task queue in decreasing traversal level of the associated gate; and
providing the task queue to the CTS engine, wherein the CTS engine synthesizes and optimizes the one or more clock trees based on the tasks in the task queue, and wherein the circuit design is subsequently provided to a semiconductor fabrication facility for producing integrated circuit chips.

12. The apparatus of claim 11, wherein the task queue includes a task that instructs the CTS engine to synthesize a net driven by a gate in the one or more clock trees without skew balancing.

13. The apparatus of claim 11, wherein the task queue includes a task that instructs the CTS engine to synthesize a net driven by a gate in the one or more clock trees, and perform skew balancing on the net.

14. The apparatus of claim 11, wherein the task queue includes a task that instructs the CTS engine to perform delay insertion to meet a given target latency for a sub-tree that is rooted at a gate in the one or more clock trees.

15. The apparatus of claim 11, wherein tasks are performed in parallel if the tasks are associated with gates in the one or more clock trees in the same traversal level.

* * * * *